(12) United States Patent
Schmitz

(10) Patent No.: US 7,713,086 B2
(45) Date of Patent: May 11, 2010

(54) PLUG CONNECTOR ON A COMPONENT WHICH IS TO BE FIXED IN A HOLE OF A BASE-PLATE

(75) Inventor: Frank Schmitz, Vettweiss (DE)

(73) Assignee: William Prym GmbH & Co. KG, Stolberg (DE)

( * ) Notice: Subject to any disclaimer, the term of this patent is extended or adjusted under 35 U.S.C. 154(b) by 0 days.

(21) Appl. No.: 12/308,317

(22) PCT Filed: Jun. 22, 2007

(86) PCT No.: PCT/EP2007/005502

§ 371 (c)(1),
(2), (4) Date: Dec. 13, 2008

(87) PCT Pub. No.: WO2008/000391

PCT Pub. Date: Jan. 3, 2008

(65) Prior Publication Data

US 2009/0305535 A1      Dec. 10, 2009

(30) Foreign Application Priority Data

Jun. 27, 2006   (DE) .................... 10 2006 029 381

(51) Int. Cl.
*H01R 13/60*     (2006.01)
(52) U.S. Cl. ...................... 439/567; 439/571
(58) Field of Classification Search ............. 439/571, 439/567

See application file for complete search history.

(56) References Cited

U.S. PATENT DOCUMENTS 5,282,758 A      2/1994   Onoue
5,462,454 A *   10/1995  Kramer et al. ............ 439/571

(Continued)

FOREIGN PATENT DOCUMENTS

| EP | 0 148 792 | 7/1985 |
| EP | 0 203 638 | 12/1986 |
| FR | 2 763 751 | 11/1998 |

*Primary Examiner*—Briggitte R Hammond
(74) *Attorney, Agent, or Firm*—Friedrich Kueffner

(57) ABSTRACT

A component (30) is to be attached by means of a plug connector (10) in a hole (53) of a base plate (50). To this end, the plug connector (10) has a shaft (15) with a flat profile. When the plug is inserted in the socket, the shaft end (20) projects out of the hole (53) on the rear side of the circuit board (52). The shaft end (20) is followed by a shaft section (13), broadened relative to the hole width (54), which has an opening (14). By means of the opening (14), the shaft section (13) is split into two legs (11, 12), which are sprung against each another and which hold the shaft (15) in the hole (53) of the circuit board (50) when the plug is inserted in the socket. To improve the holding effect, the two legs (11, 12) are constructed differently one from the other, wherein one leg (11) has a greater longitudinal extension (21) than the other (12). This means that the broadened shaft section (13) splits into a long (11) and a short leg (12). Both legs (11, 12) taper into an undercut head (40) on the shaft end (20). When the plug is inserted in the socket, the head (40) engages with the hole-edge of the circuit board (50).

23 Claims, 7 Drawing Sheets

U.S. PATENT DOCUMENTS 5,613,877 A * 3/1997 Patel et al. .................. 439/567
5,989,064 A * 11/1999 Harlan et al. ............... 439/567
2005/0061543 A1 3/2005 Sagayanathan et al.
2005/0090155 A1 4/2005 Blossfeld

* cited by examiner

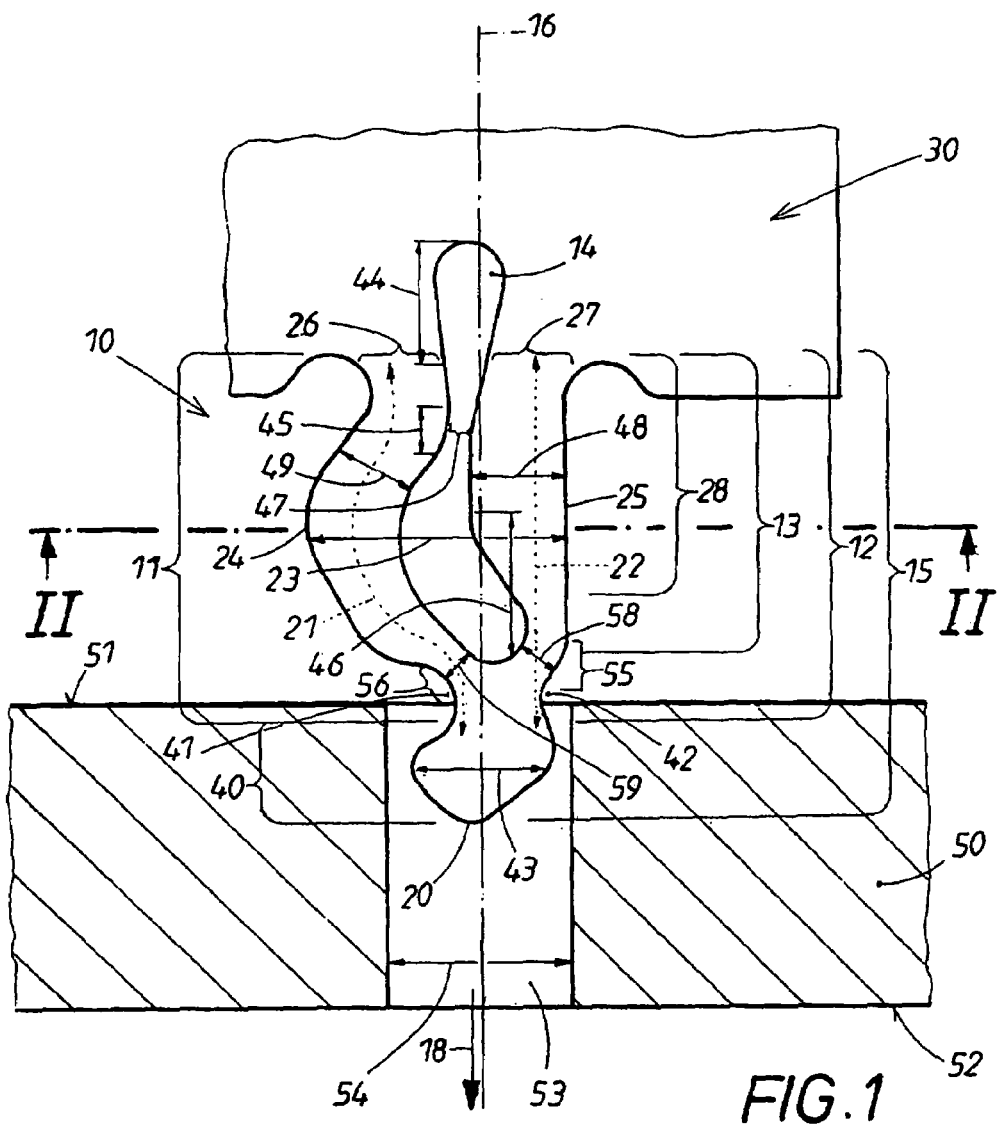
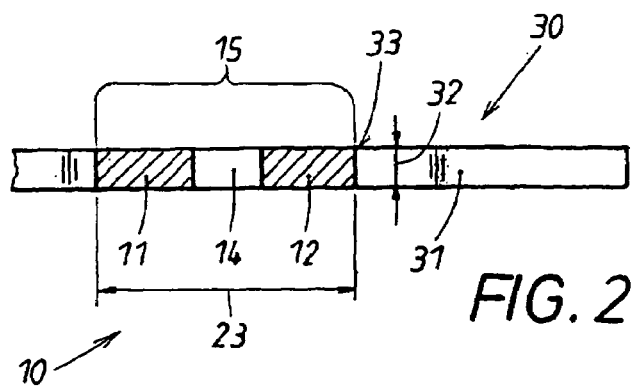
FIG. 1
FIG. 2

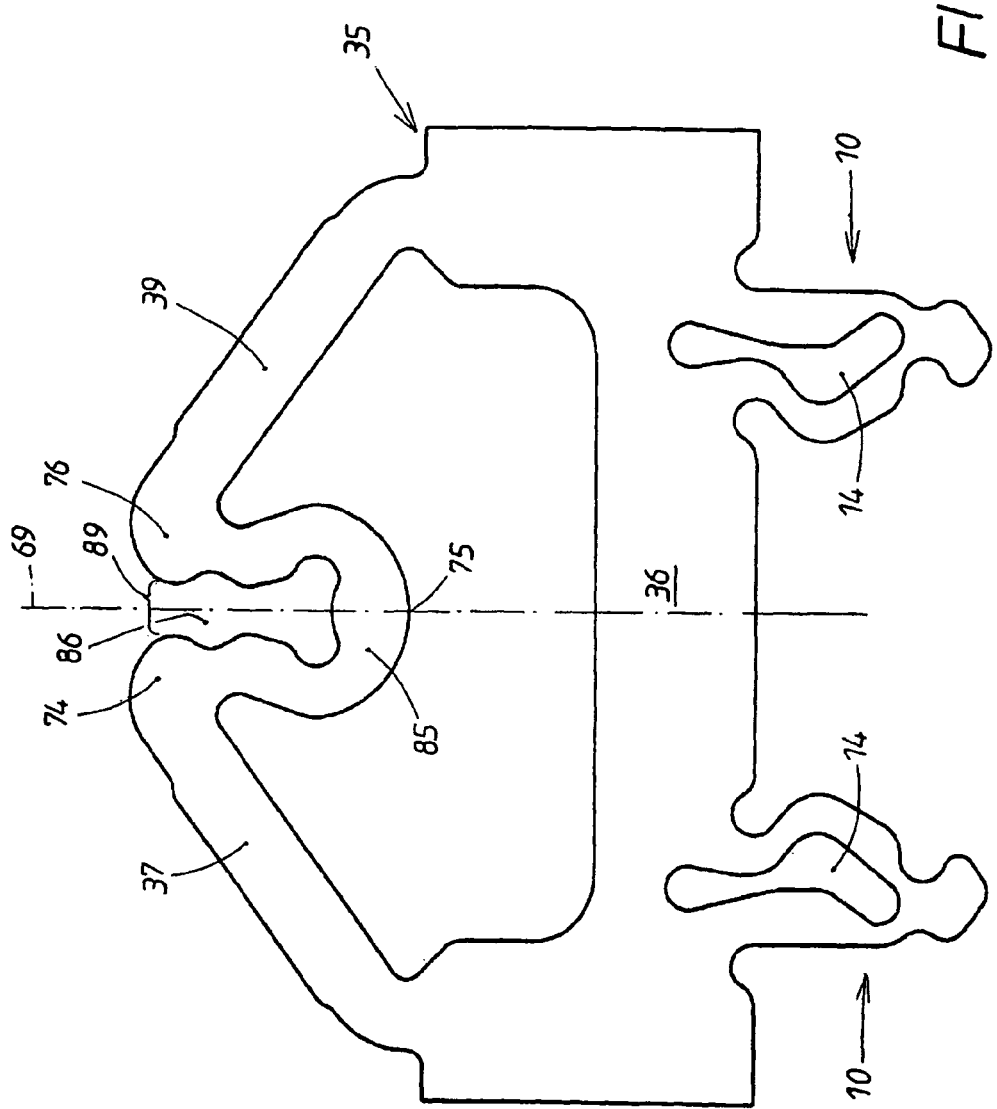

PLUG CONNECTOR ON A COMPONENT WHICH IS TO BE FIXED IN A HOLE OF A BASE-PLATE

The invention pertains to a plug connector of the type indicated in the introductory clause of claim 1. The known plug connector is described in the technical book Einpresstechnik (Press-Insertion Technology) by Ralf Nolde, Eugen G. Leuze Verlag, 1994, p. 56, FIG. 3.12, and an application to a shield housing is illustrated in FIGS. 8 and 9.

Because the plug connector has a flat cross section, it can be manufactured quickly and inexpensively by stamping it out of sheet metal. The known plug connector has a flat profile with a widened shaft section, the longitudinal center of the widened section of the flat profile being provided with a central longitudinal opening. The opening divides the shaft section of the known plug connector into two sidepieces, which are mirror images of each other, and which are able to move elastically with respect to each other in the plane of the flat profile. When the plug connector is inserted into a hole in a base-plate, the two sidepieces exert an elastic force, which has the effect of clamping the plug connector firmly in place in the hole in the plate. The end of the shaft has a slender, straight shape. The slender end of the shaft passes through the hole in the plate without being deformed and projects out of the hole at the rear surface of the plate. The known plug connector is held in place in the plate only by the previously mentioned clamping force. The connection is only non-positive in nature. The plug connector can be pulled back out again easily once the clamping force has been overcome.

As already said above, FIGS. 8 and 9 show a known shield housing, which is intended to cover electrical components mounted on a circuit board. The known finished housing is shown in FIG. 9, where the edge areas of the housing sidewalls are provided with a plurality of the previously mentioned plug connectors. These known plug connectors project from the sidewalls of the housing and are designed as integral parts of the half of the housing to which they belong, because the housing halves, too, are stamped out of sheet metal. The disadvantage is that the housing must be produced from two cooperating housing halves, as shown in the exploded diagram of FIG. 8. One half of the housing produces the front and the rear sidewalls of what will later become the complete housing of FIG. 9, whereas the other half forms the left and the right sidewalls with the associated plug connectors.

It is obvious that plug connectors of this type could also be arranged on other types of components intended to be mounted in holes in base-plates. As previously mentioned, the known plug connectors with a flat profile can be manufactured very cheaply by stamping, but they suffer from the disadvantage that they are not seated reliably in the hole.

FR 2 763 751 shows a plug connector of a different type. Here the shaft is bent into the shape of a crank and has an notch, which allows a tongue to be formed in the middle of the shaft, projecting out from the plane of the shaft. Whereas the end of the tongue lies in a first plane, two arms remain, one on each side of the notch, which lie in a different plane. The tongue moves elastically with respect to the plane of the two arms. There is no widened area situated in the plane of the two arms, however, which could produce an undercut head. This known plug connector can be pulled easily out of the hole in the base-plate.

EP 0 203 638 A2 shows a plug connector with a forked shaft with two legs, one on each side of a profiled slot. After insertion, the ends of the two legs project out from the hole in the base-plate. Because of the profiling of the slot in the fork, the ends of the legs are spread apart and grip the hole from underneath.

The invention is based on the goal of developing an inexpensive plug connector of the type indicated in the introductory clause of claim 1 which is easy to handle and which is characterized by the reliability with which it remains mounted in the base-plate. This is achieved according to the invention by the measures mentioned in claim 1, to which the following special meaning attaches.

In the invention, the two sidepieces of the widened shaft section are designed differently from each other. Relative to their longitudinal extension, the one sidepiece is longer than the other, for which reason they can be called the "long sidepiece" and the "short sidepiece". When the connector is inserted into the hole in the plate, the long sidepiece therefore behaves differently than the short one. This property is used in the invention to move an undercut head seated on the end of the shaft transversely to the insertion direction during the last phase of the insertion process. During the initial phase of the insertion movement, the head is aligned with the open cross section of the hole, for which reason the head is not prevented from passing through. The width of the head is smaller than or equal to the cross section of the hole. When, however, the head is projects out again from the rear surface of the plate, the cooperation between the long and the short sidepieces ensures that the previously mentioned transverse movement of the head takes place. As a result, after insertion, the head grips one edge of the plate from underneath, i.e., an edge which forms the boundary of the hole. It is then no longer possible to pull the plug connector easily back out of the base-plate. The inventive plug connector is therefore held securely in place in the hole in the plate by a positive type of connection.

Additional measures and advantages of the invention can be derived from the subclaims, from the following description, and from the drawings. The drawings illustrate two different exemplary embodiments of the invention:

FIG. 1 shows an enlarged side view of an inventive plug connector, which can be formed on any desired first component;

FIG. 2 shows a cross section through the plug connector of FIG. 1 along line Ia-Ia of that figure, from which the flat cross section of its shaft can be seen;

FIG. 5 shows the use of a dual design of the inventive plug connector on a second component, which can be used as a fastener for any desired functional part, the connector being in the resting state here, that is, before insertion of the fastener;

Figure 6:
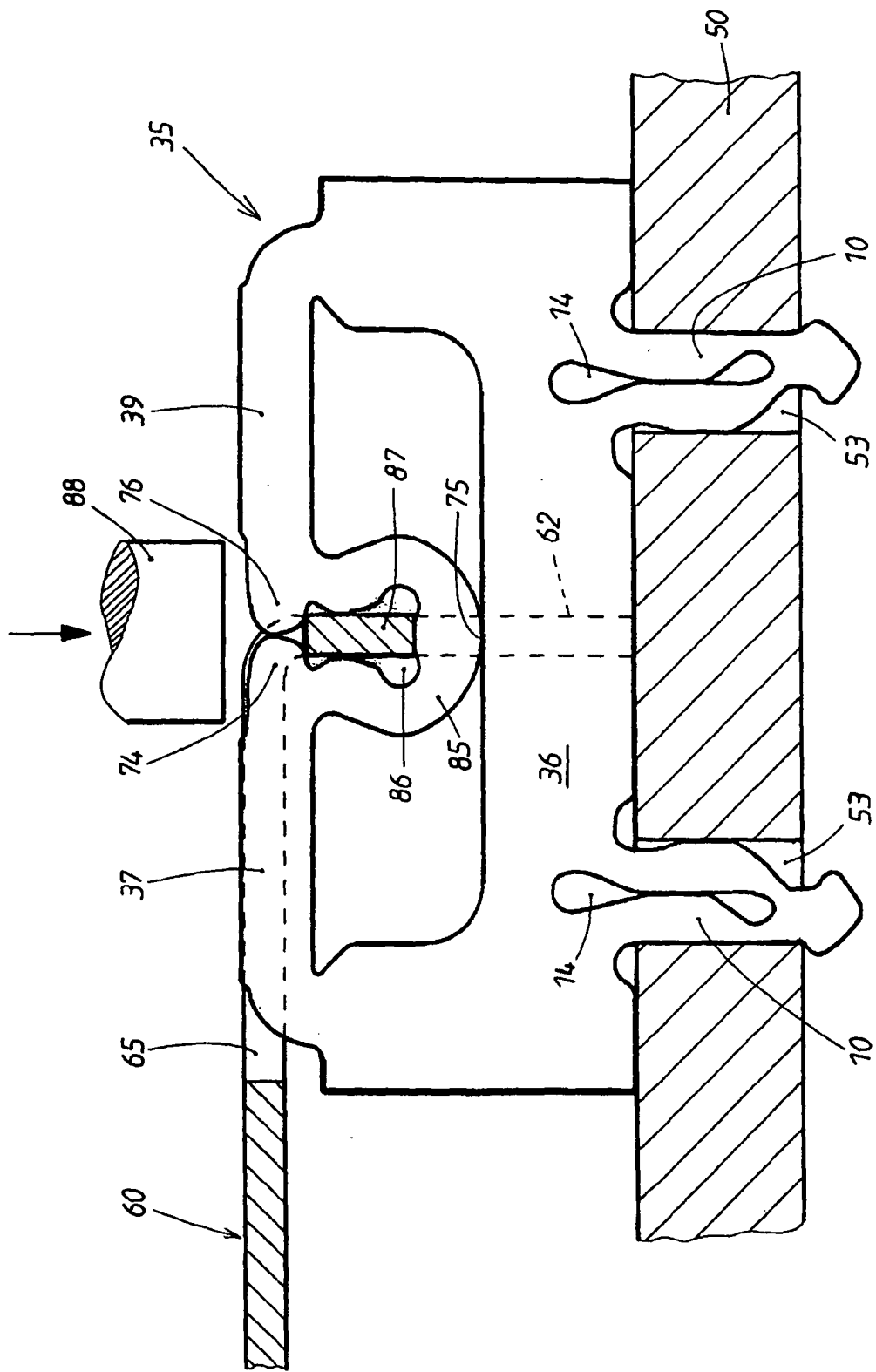
Figure 7:
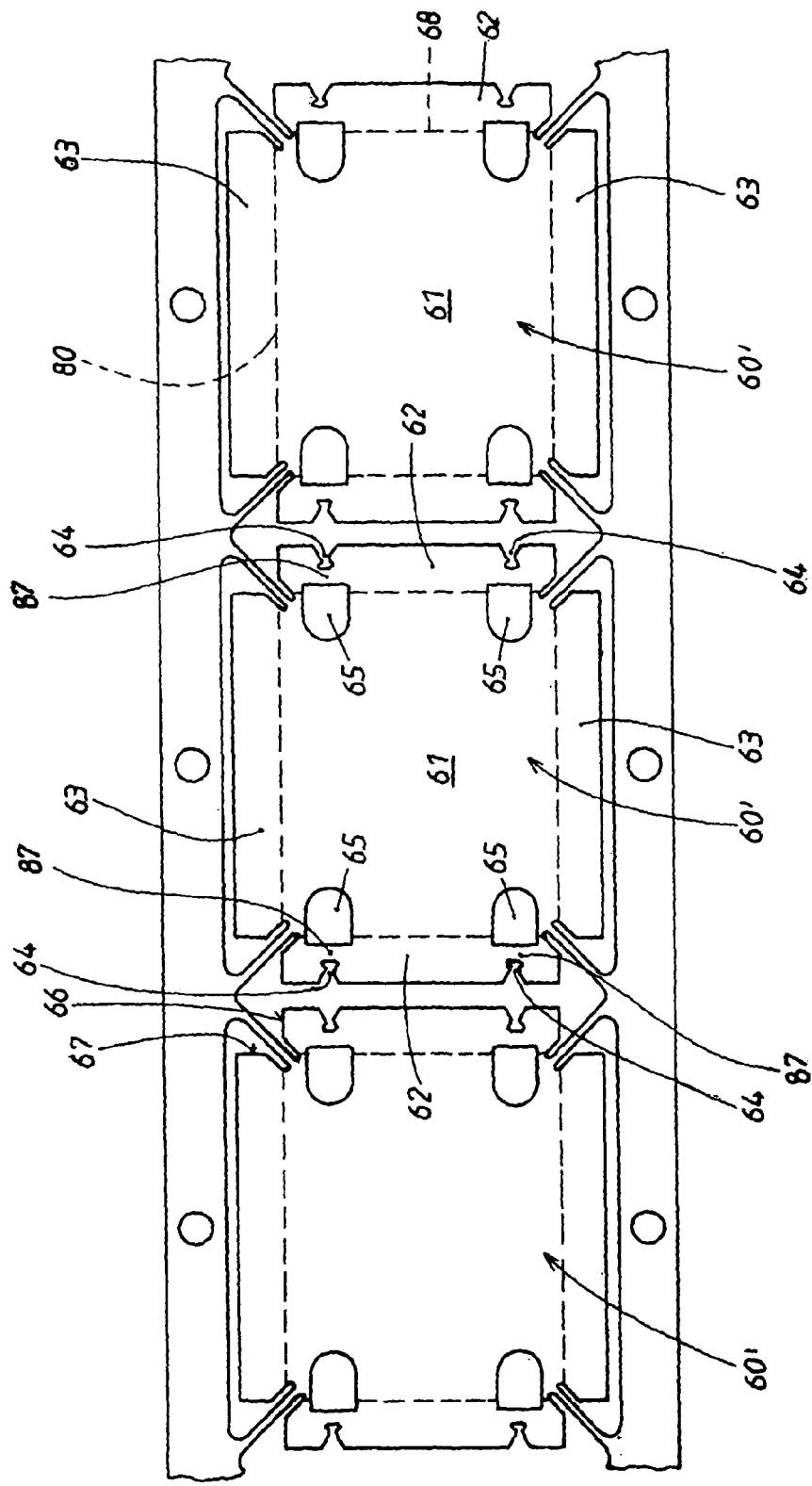
Figure 8:
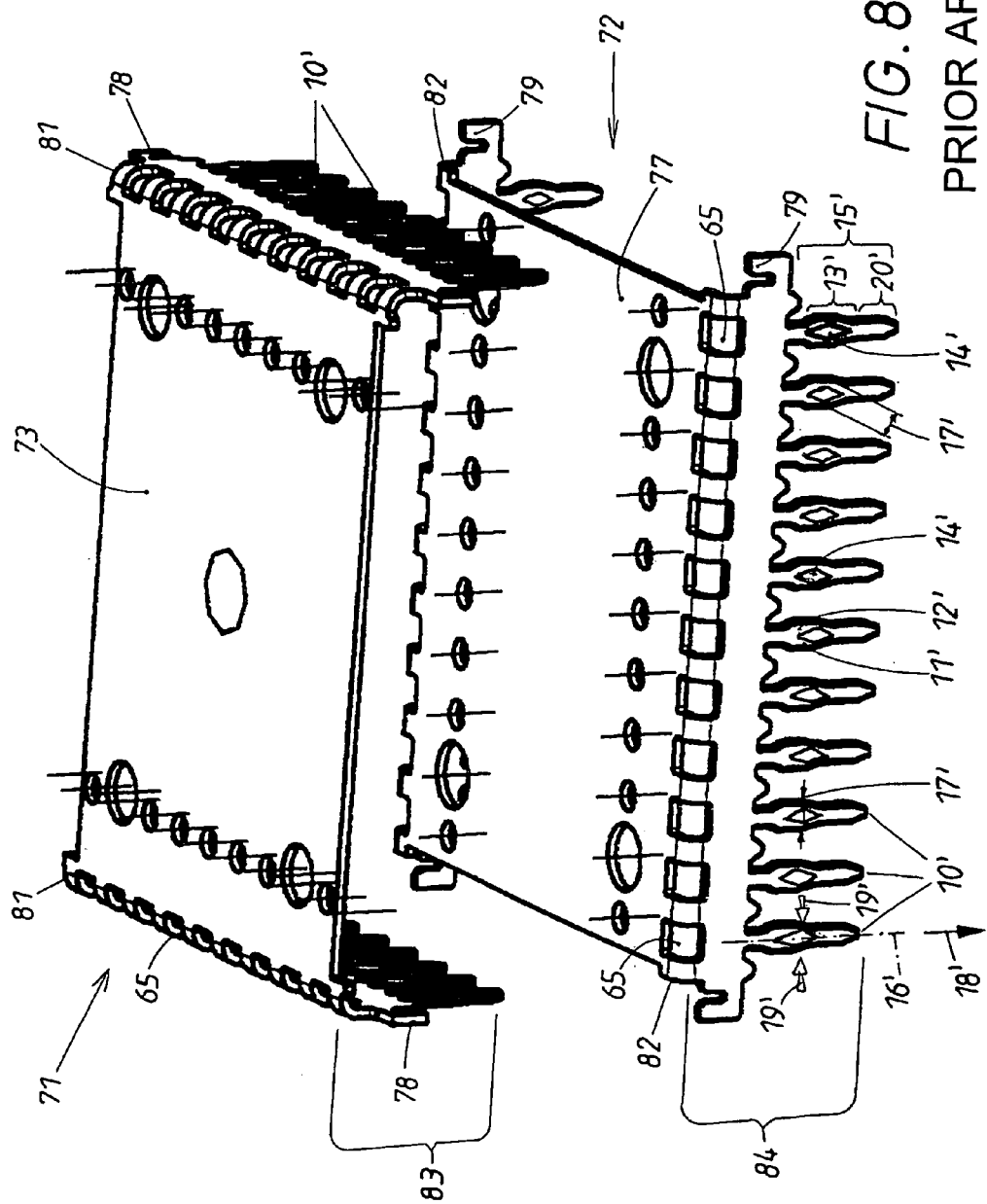
Figure 9:
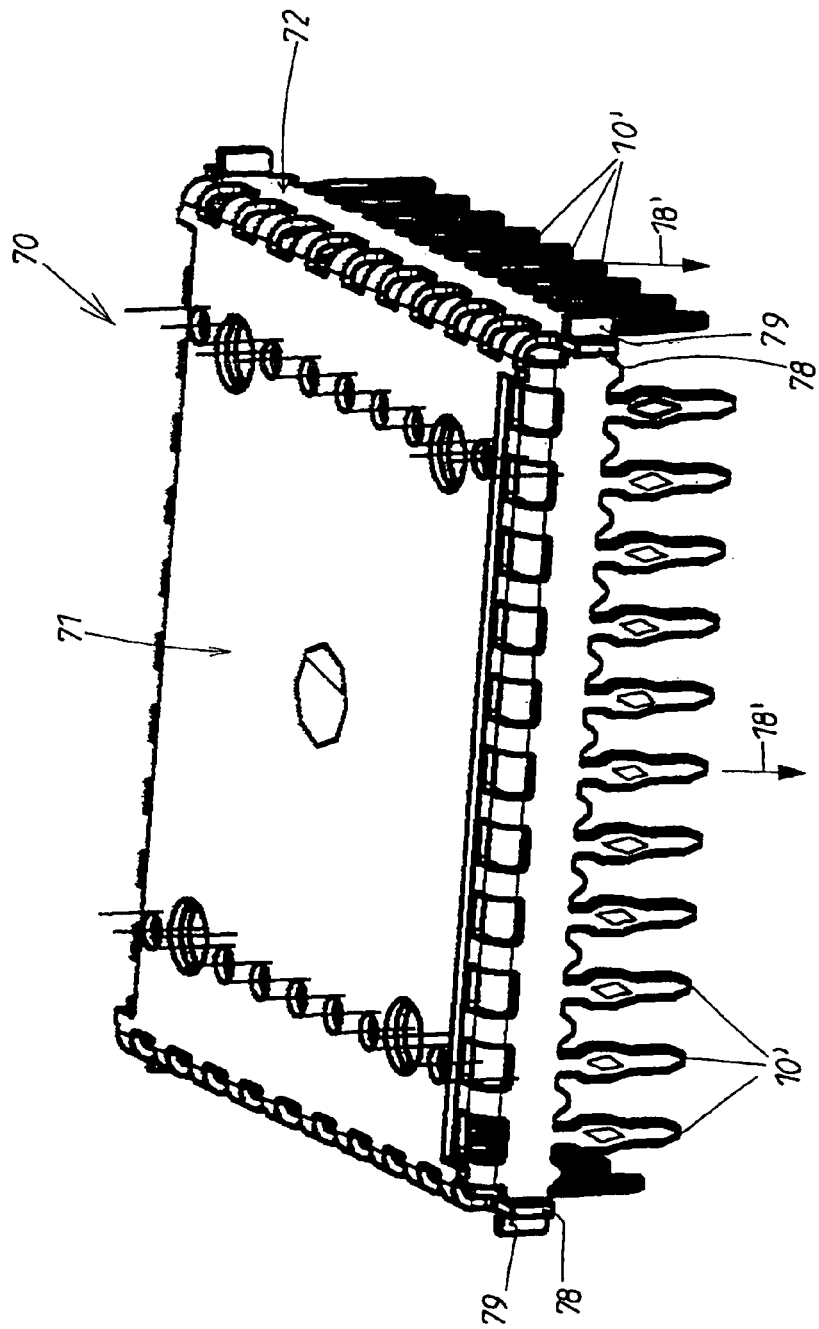

FIG. 6 shows an application of the fastener of FIG. 5, where a functional part is mounted on a circuit board by means of the fastener, and where, in the exemplary embodiment illustrated here, the functional part consists of a shield housing of a design simpler than that of FIGS. 8 and 9; and FIG. 7 shows a preliminary stage in the production of the shield housing of FIG. 6, where several semi-finished housings have been stamped out of a strip of sheet metal and need only to be separated and bent over along their edges.

As previously mentioned, FIGS. 8 and 9 show the prior art. The same reference numbers are used to designate the parts of this prior art which are similar to those of the invention, but these numbers are also provided with an apostrophe (') to distinguish them from the invention and its application.

FIG. 8 shows the previously mentioned exploded diagram, representing a perspective view of the two housing parts 71, 72, which are put together, as shown in FIG. 9, to obtain a shield housing 70.

Each housing part 71, 72 consists of its own cover plate 73, 77, which is provided on opposite sides with angled edge zones 83, 84. Each housing part 71, 72 therefore has two bent edges 81, 82, which are oriented in opposite direction with respect to each other. The bent edge 81 of the first housing part 71 is transversely oriented, whereas the bent edge 82 of the second housing part 72 is longitudinally oriented. Thus the first housing part 71 has a U-shaped longitudinal profile, and the housing part 72 has a U-shaped transverse profile.

The end areas of the individual edge zones 83, 84 are each provided with a group of the known plug connectors 10', each of which comprises a shaft 15'. The plug connector 10' is symmetric in design in all respects with respect to a longitudinal axis 16', indicated in dash-dot line in FIG. 8. There is a widened shaft area 13', in which an opening 14' is provided. The width 17' of this shaft section 13' is greater than the open diameter of a hole (not shown) in a base-plate. Two similarly formed sidepieces 11', 12', which move elastically toward each other upon insertion 18' according to FIG. 8 in the direction of the force arrows 19, are created along both of the longs sides of the opening 14'. A slender, straight shaft section 20', the width of which is less than or equal to the open diameter of the hole, is provided in front of the widened shaft section 13'.

To facilitate the previously mentioned bending 81, 82 of the known housing parts 71, 72 of FIG. 8, groups of holes 65 are provided. The finished housing 70 of FIG. 9 is assembled by nesting the two housing parts 71, 72 of FIG. 8 into each other. The two housing parts 71, 72 are held together by complementary clamp shoulders 78, 79, which function as clamp and counterclamp. When the two housing parts are assembled, the clamps 78 and counterclamps 79 become locked into each other in pairs. Because of the two housing parts 71, 72, the overall housing 70 has a two-layer cover plate 73, 77, which means that a large amount of material is used. Because of the nonpositive action of the known plug connector 18', a large number of them must be provided all along the edge areas of the finished overall housing 70 in order that, through the addition of the numerous individual spring forces 19' provided, the housing 70 can be fastened to the base-plate with enough strength to be acceptable.

In this respect, the invention proceeds in an entirely different and superior direction, which will be explained on the basis of the plug connector of FIGS. 1-4. For the sake of clarity, many of the same reference numbers as those of FIGS. 8 and 9 are used to designate analogous parts of the inventive plug connector 10, as previously mentioned, but here without the apostrophe (').

As can be seen in FIG. 1, the plug connector 10 is formed as an integral part of any desired type of component 30 to be mounted on a base-plate 50. In the base-plate 50 there is a hole 53, into which the shaft 15 of the plug connector 10 is to be inserted in the direction of the arrow 18. For this purpose, the longitudinal axis 16, indicated in dash-dot line, of the shaft 15 is first aligned with the hole 53. The shaft 15 has a shaft section 13, in which the width 23 of the sidepieces is greater than the open diameter 54 of the hole 53. There is a shaft opening 14 in this area, however, which is not only asymmetric to the longitudinal axis 16 but also offset from it. Two sidepieces 11, 12 are thus formed, one on each side of the opening 14, but these are designed very differently from each other.

The different longitudinal courses 21, 22 of the two sidepieces 11, 12 are indicated as dotted lines in FIG. 1. The configuration present here arises because the one sidepiece 11 has a curvature 24, whereas the other sidepiece 12 has a straight course 25. To distinguish the two sidepieces more clearly from each other, the one sidepiece 11 is referred to as the "long sidepiece" and the other 12 as the "short sidepiece" in correspondence with their different lengths. The two sidepieces 11, 12 terminate at their ends 20 in a head 40, which has an undercut 41 at the transition between the head and the long sidepiece 21 and another undercut 42 at the transition between the head and the short sidepiece 22. The head 40 has a maximum width 43, which is equal at most to the open diameter 54 of the hole. The head 20 therefore does not interfere with the insertion movement 18 into the hole 53. When we look at the longitudinal course 21 shown in dotted line, we see that the long sidepiece 11 has the shape of an "S".

As FIG. 2 illustrates, the component 30 comprising the plug connector 10 consists of a product stamped out of a piece of sheet metal 31. The shaft 15 therefore has a flat profile 33 in cross section, the height of which is equal to the thickness 32 of the sheet metal of FIG. 2. In the cross section of FIG. 2, we can see the long sidepiece 11 at the crest of the curve where the shaft reaches the point of maximum width 23, then the intermediate part of the opening 14, and the cross section of the short sidepiece 12.

The asymmetric opening 14 in the shaft 15 can be divided into at least three zones 44-46. There is a central zone 45, which comprises a constriction 47. Adjoining this central zone 45, the opening 14 has a widened upper end zone 44 and a widened lower end zone 46. The upper end zone 44 extends beyond the points 26, 27 where the two sidepieces 11, 12 merge with the component 30. Proceeding from the constriction 47, the upper end zone 44 widens continuously to its crest point. The lower end zone 46 follows for the most part the curvature 24 of the long sidepiece and thus intersects the longitudinal axis 16 of the shaft. From a point a certain distance away from the constriction, the width of the lower end zone 46 of the opening 14 remains uniform.

The external shape of the two sidepieces 11, 12 and the asymmetric opening 14 described above result in the formation of a widened part 28 in the short sidepiece 12. The resulting width 48 of the sidepiece here stiffens the short sidepiece 12. This widened part 28 merges with the head 40 by way of an end part 55 of narrower width 58. The same is also true for the long sidepiece 11. This sidepiece 11 has an almost uniform width 49, but it, too, has an end piece 56 which merges with the head 40 by way of an area of reduced width 59.

During the insertion 18 according to FIG. 2, the long sidepiece 11 strikes one edge of the hole 53, as a result of which its curvature 24 is pressed toward the shaft axis 16. The short sidepiece 12 has an essentially straight outside edge 29, which can slide along the opposing edge 57 of the hole.

Figure 4:
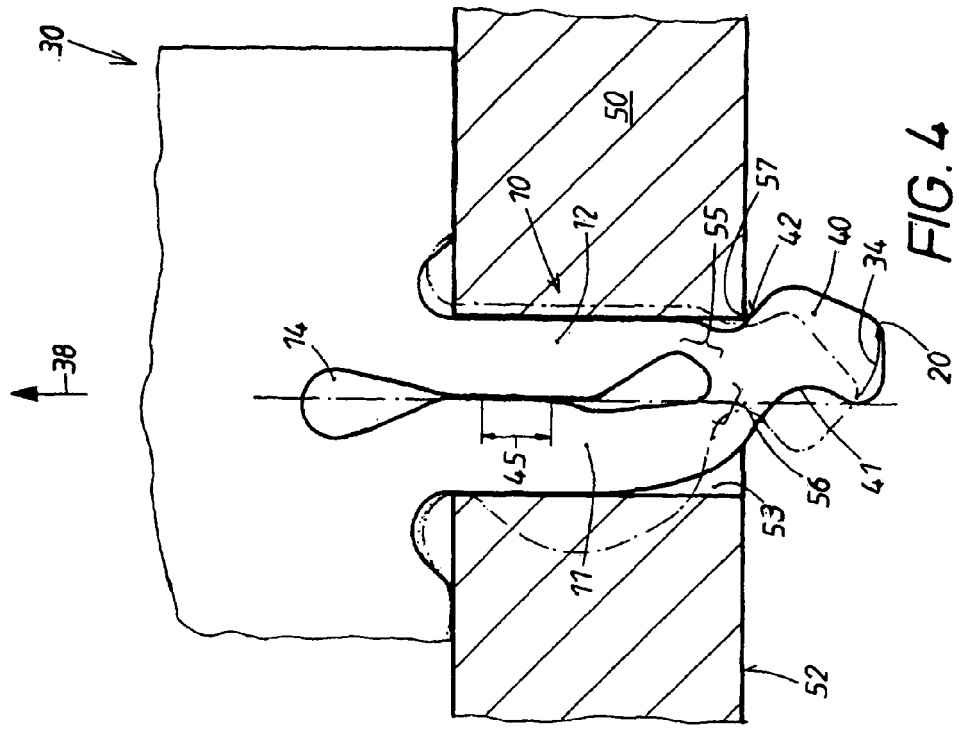
FIG. 4 shows a diagram, similar to FIGS. 1 and 3, of the inventive plug connector after its insertion.
Figure 3:
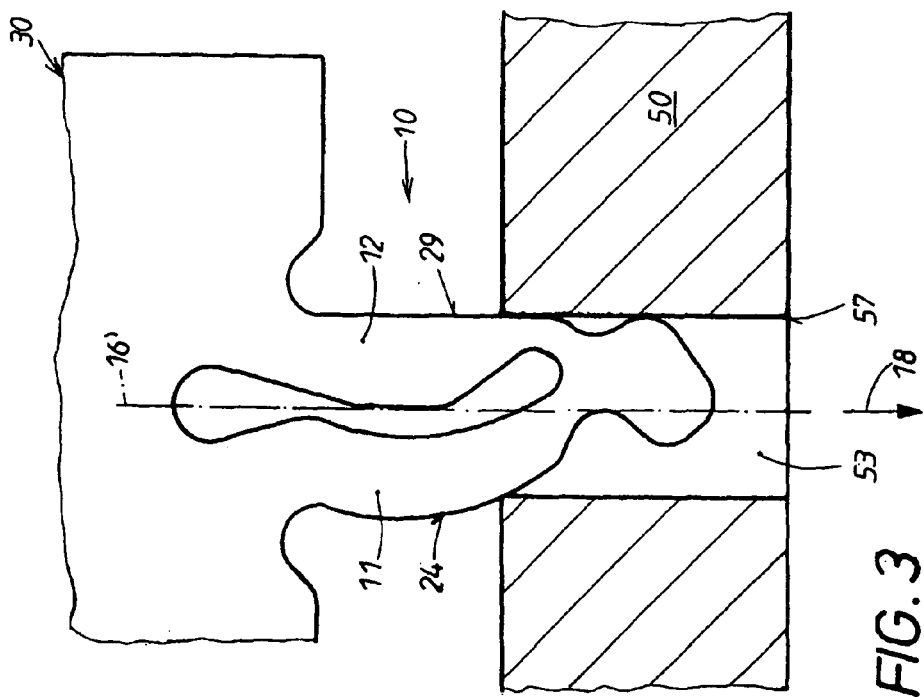
FIG. 3 shows a first phase of the insertion movement of the plug connector into a hole in a base-plate.

The completely inserted state is shown in FIG. 4. The inserted state is characterized in that the head 40 is now projecting from the rear surface 52 of the plate. The two sidepieces 11, 12 have been squeezed together to such an extent that the opposing edges of the opening 14 are almost touching in the central zone 45. The resting state with undeformed sidepieces 11, 12 according to FIG. 1 is indicated in FIG. 4 in dash-dot line. As can be seen from FIG. 4, during the transition from the resting state shown in dash-dot line to the inserted state shown in solid line, a pivoting movement 34 of the head also takes place, as illustrated by a pivot arrow. The result is that the undercut 42 of the head 40 grips the edge 57 of the hole from underneath. In the inserted state of FIG. 4, the opposing undercut 41 on the long sidepiece 11 becomes more straightened out in comparison with the resting state of FIG. 1, illustrated in dash-dot line in FIG. 4.

This pivoting movement 34 of the head 40 is possible because both the narrow end part 55 of the short sidepiece 12 and also the corresponding narrow end part 56 on the long sidepiece 11 function as bending sites. In the inserted state of FIG. 4, the gripping-from-underneath by the head 40 prevents the plug connector 10 of component 30 from being pulled out of the hole 53 in the plate 50 in the direction of the arrow 38 of FIG. 4. A positive connection is present. As a result of the inventive design of the plug connector, the inserted state of the component 30 in the plate 50 is secured.

FIGS. 5 and 6 show an application of the plug connector 10. In this case, the component consists of a fastener 35. The entire fastener 35 is produced as a stamped product and has two plug connectors 10 of the previously described type arranged as mirror images of each other on the bottom edge of the central piece 36. The entire fastener 35 is designed with mirror-image symmetry with respect to a central longitudinal axis of symmetry 69 shown in dash-dot line. The also applies with respect to the two clamping arms 37, 39 arranged on the upper edge of the central piece 36; in the loose state of FIG. 6, the free ends 74, 76 of these two clamping arms are at a slant. The two free ends 74, 76 of the arms are connected to each other by a loop 85, the interior space 86 of which can comprise a lobed profile. The fastener 35 is used to fasten any desired functional part such as, in the present case, a shield housing 60, to a circuit board 50. This is done by means of a web 87, several of which are arranged on the shield housing 60. The shape of the housing 60 can be described most easily on the basis of FIG. 7.

FIG. 7 shows a metal strip, from which a group of semi-finished products 60' have been stamped. The housing 60 itself is formed by separating these semi-finished products 60' from the strip and by bending them. FIG. 6 shows part of such a housing. The semi-finished products 60' are stamped out section-by-section from the metal strip and remain connected to the edge parts of the metal strip by metal bridges, which remain to be cut. The shape which the housing 60 will assume can already be seen from the semi-finished product 60'.

What will later become the housing 60 has, roughly speaking, the shape of a shell, which must be turned over. It can be divided into an essentially flat cover plate 61, which is formed by the central area of the stamped-out semi-finished product 60' shown in FIG. 7. The end product 60 is obtained from the semi-finished product 60' by bending over the edge strips 62, 63, which extend around the cover plate 61, to form a right angle. Thus the opposing ends 66, 67 of the edge strips come in contact with each other. After they have been bent over, the two edge strips 62, 63 now serve the same function of forming the sidewalls of the finished housing 60. This can be seen in FIG. 5. In addition, the edge strips 62 also serve the following additional function.

At the transition between the cover plate 61 and the edge strips 62, holes 65 have already been stamped out during the production of the semi-finished product 60'. One or two holes 65 in the transition area to the opposing edge strip 62 are sufficient. The edge strips 62 are also provided with edge notches 64 aligned with the holes 65, so that a web 87 is created between them. As FIGS. 6 and 7 illustrate, the webs 87 start just underneath the bent edge 68 between the cover plate 61 and the edge strip 62. Because these webs 87 are formed out of the sheet metal material of the housing 60, they have a rectangular shape. As previously mentioned, the fasteners 35, when in use, have the task of fastening the housing 60 to the circuit board 50. This is done by mounting the web 87 in the interior 24' of the loop according to FIG. 6 in the special manner to be described below.

Even in the resting state of FIG. 5, the interior 86 of the loop of the fastener 87 does not have a smooth U-shape but is profiled instead. It has opposing lateral lobes and another lobe on the bottom. The function of these lobes can be derived from FIG. 6, which illustrates the fastened state. Here the two arms 37, 39 have been squeezed together by a tool 88 to such an extent that the two arms 37, 39 in FIG. 5 are flattened out, therefore forming an angle of approximately 180°. The extent to which the two sidepieces 37, 39 are squeezed together can be limited by the crest 75 of the loop, which strikes the upper edge of the central piece 36. When this flattening occurs, the two elastic ends 74, 76, as FIG. 6 shows, come in contact with each other and thus close off the loop opening 89, thus forming a "zero opening". Before that, i.e., in the resting state of FIG. 5, the loop opening 92 is sufficiently large to accept the insertion of the web 87. In FIG. 4, the crest 75 of the loop is still a considerable distance away from the central piece 36.

In the fastened state of FIG. 6, the web 87 is captured in the interior 86 of the loop. The fastener 35 is made of a material which, after the arm ends 74, 76 have been pressed flat, will be held in place by the inside profiling. The two lateral lobes in the interior 86 of the loop are pressed from opposite sides against the flat profile of the web 87, whereas the outer end surface of the web 87 is supported on the lobe on the bottom. As FIG. 6 also shows, the inner boundary of the web 87 which faces the hole is brought into contact with the flat-pressed ends 74, 76 of the arms. As can be seen, the web 87 is thus held without play in the interior 86 of the loop.

The inventive housing 60 is obtained, as FIG. 6 illustrates, by bending over all four edges, that is, not only the transverse edge strips 62 versus the cover plate 61 at the previously mentioned first bending edges 68 but also versus the longitudinal edge strips 63. At that point there is formed a second bending edge 80 according to FIG. 7. By the bendings 68, 80 of the edge areas 62, 63, a one-piece, shell-like housing 60 is obtained from the semi-finished stamped product 60' of FIG. 7, which can be fastened to the circuit board 50 by means of four fasteners 35 in the manner shown in FIG. 5 as previously described. The shell-like housing 60 uses less material than the previously described prior art and is also simpler in design and is characterized in that it can be manufactured more quickly and is also easier to mount because of the inventive fasteners 35.

Although the fastener 35 and the housing 60 are separate parts, the fastener can be used anywhere. The inventive fastener 35 can serve as a connecting means for connecting functional parts of any desired type to a base 50. For example, it is possible without any modification to mount a shell-like housing 60 of larger or smaller dimensions to a base 50 by means of the same fastener 35.

LIST OF REFERENCE NUMBERS

10' known plug connector (FIGS. 8, 9)
11' first sidepiece (FIG. 8)
12' second sidepiece (FIG. 8)
13' widened part of shaft 15' (FIG. 8)
14' opening in 13' (FIG. 8)
15' shaft of 10' (FIG. 8)
16' longitudinal axis of shaft 15' (FIG. 8)
17' width of shaft at 13' (FIG. 8)
18' arrow of the insertion movement of 10' (FIG. 8)
19' force arrow of the elastic action of 11', 12' (FIG. 8)
20' straight part of shaft 15' (FIG. 8)
10 inventive plug connector (FIGS. 1-6)

11 long sidepiece (FIGS. 2-4)
12 short sidepiece (FIGS. 2-4)
13 widened part of shaft
14 opening in 13
15 shaft
16 longitudinal axis of 15 (FIGS. 1, 3, and 4)
18 arrow of the insertion movement of 10
20 end of shaft 15
21 longitudinal course of 11 (FIG. 1)
22 longitudinal course of 12 (FIG. 1)
23 maximum shaft width of 13
24 curvature of 11, curved course (FIG. 1)
25 straight course of 12 (FIG. 1)
26 point where 11 merges with 30 (FIG. 1)
27 point where 12 merges with 30 (FIG. 1)
28 widened part of sidepiece 12 (FIG. 1)
29 outside edge of 12 (FIG. 3)
30 component (FIGS. 1-3)
31 sheet metal of 30 and 10
32 thickness of the sheet metal, profile height of 31
33 flat profile of 10 (FIG. 2)
34 pivoting movement of 40 (FIG. 4)
35 fastener (FIGS. 5, 6)
36 central piece of 35 (FIG. 5)
37 first clamping arm on 35 (FIG. 5)
38 arrow of the pulling-out movement (FIG. 4)
39 second clamping arm on 35 (FIG. 5)
40 head of 15 (FIG. 1)
41 undercut of 40 versus 11 (FIG. 1)
42 undercut of 40 versus 12 (FIG. 1)
43 maximum width of head 40 (FIG. 1)
44 upper end zone of 14 (FIG. 1)
45 central zone of 14 (FIG. 1)
46 lower end zone of 14 (FIG. 1)
47 constriction of 14 in 45 (FIG. 1)
48 large sidepiece width in 28 (FIG. 1)
49 sidepiece width of 11 (FIG. 1)
50 base-plate, circuit board
51 front surface of 50 (FIG. 1)
52 rear surface of 50 (FIGS. 1, 4)
53 hole (FIGS. 1, 3, 4, and 6)
54 open width of hole 53 (FIG. 1)
55 narrow end part of sidepiece 12 (FIGS. 1, 4)
56 narrow end part of 11 (FIGS. 1, 4)
57 edge of hole 53 (FIGS. 3, 4)
58 sidepiece width of 55 (FIG. 1)
59 sidepiece width of 56 (FIG. 1)
60 functional part, shield housing (FIG. 6)
60' semi-finished stamped product for 60 (FIG. 7)
61 cover plate of 60
62 transverse edge strip of 60, 60' (FIGS. 6, 7)
63 longitudinal edge strip of 60 (FIG. 7)
64 edge notch in 60, 60' (FIGS. 6, 7)
65 hole in 62 (FIGS. 6, 7)
66 lateral edge at end of 62 (FIG. 7)
67 lateral edge at end of 63 (FIG. 7)
68 first bending edge between 61, 62 (FIGS. 6, 7)
69 axis of symmetry of 35 (FIG. 5)
70 housing according to the prior art (FIG. 9)
71 first housing part of 70 (FIGS. 8, 9)
72 second housing part of 70 (FIGS. 7, 9)
73 cover plate of 71 (FIG. 8)
74 free end of arm 37 (FIGS. 5, 6)
75 crest of 20 (FIGS. 5, 7)
76 free end of arm 38 (FIGS. 5, 7)
77 cover plate of 72 (FIG. 8)
78 clamp shoulder on 71 (FIG. 8)
79 counterclamp shoulder on 72 (FIG. 8)
80 second bending edge between 61 and 63 (FIG. 7)
81 transverse bending edge on 71 (FIG. 8)
82 longitudinal bending edge on 72 (FIG. 8)
83 edge zone of 71 (FIG. 8)
84 edge zone of 72 (FIG. 8)
85 loop between 74 and 76 (FIGS. 5, 6)
86 interior of loop 85 (FIGS. 5, 6)
87 web on 60 (FIGS. 6, 7)
88 tool (FIG. 6)
89 opening of loop 85 (FIG. 5)

The invention claimed is:

1. A plug connector (10) on a component (30), which can be fastened in a hole (53) in a base-plate (50),
with a shaft (15), which comprises a flat profile (33), the end (20) of which, after insertion, projects out of the hole (53) at the rear surface (52) of the plate;
where the end of the shaft (20) is followed by a shaft section (13) which is wider than the diameter (54) of the hole and which has an opening (14) in the flat profile (33);
and where the opening (14) divides the shaft section (13) into two sidepieces (11, 12), which move elastically with respect to each other in the plane of the flat profile (33) and after insertion clamp the shaft (15) tightly in the hole (53) in the plate (50),
wherein
the two sidepieces (11, 12) are designed differently from each other, the one sidepiece (11) comprising a longer longitudinal course (21) than the other (12), for which reason this section (13) of the shaft consists of a long sidepiece (11) and a short sidepiece (12);
where the end (20) of the shaft has an undercut head (40), which, after insertion, grips an edge (57) of the plate (50) forming the boundary of the hole (53) from underneath.

2. A plug connector according to claim 1, wherein the long sidepiece (11) is curved, whereas the short sidepiece (12) is essentially straight.

3. A plug connector according to claim 1, wherein the long sidepiece (11) has the shape of an "S".

4. A plug connector according to claim 1, wherein the opening (14) between the two sidepieces (11, 12) is asymmetric and follows the curvature of the long sidepiece (11).

5. A plug connector according to claim 1, wherein the opening (14) comprises a constriction (47) in its central zone (45) even in the resting state, i.e., before the plug connector (10) has been inserted;
and the opening (14) has widened end zones (44, 46) at both ends, i.e., one proceeding from the constriction (47) toward the head (40), the other proceeding from the constriction toward the component (30).

6. A plug connector according to claim 5, wherein the upper end zone (44) of the opening (14) extends into the component (30) beyond the points (26, 27) at which the two sidepieces (11, 12) merge with the component.

7. A plug connector according to claim 4, wherein the zone (46) of the opening (14) lying underneath the constriction (47) of the opening essentially follows the course of the curvature of the long sidepiece (11).

8. A plug connector according to claim 1, wherein the short sidepiece (12) has a widened part (28) of greater width (48), which has the effect of stiffening the short sidepiece (12).

9. A plug connector according to claim 8, wherein a shaft end part (55) of narrower width (58) is provided at the end (20) of the shaft between the widened part (28) and the head (40).

10. A plug connector according to claim 9, wherein the narrow end part (55) serves as a bending point for the head

(40) at the end (20) of the shaft during the transition from the resting state to the inserted state.

11. A plug connector according to claim 1, wherein the long sidepiece (11) comprises an essentially uniform width (49) but has a narrow end part (56) at the transition to the terminal head (40).

12. A plug connector according to claim 11, wherein the narrow end part (56) of the long sidepiece (11) also functions as a bending point for the terminal head (40) during the transition from the resting state to the inserted state.

13. A plug connector according to claim 1, wherein, when seen in the resting state, an undercut (42, 41) on the terminal head (40) of the shaft (15) is provided not only on the short sidepiece (12) but also on the long sidepiece (11).

14. A plug connector according to claim 12, wherein the undercut (41) of the head (40) on the long sidepiece (11) has a straighter course in the inserted state than it does in the resting state.

15. A plug connector according to claim 1, wherein the component is a fastener (35) for a separate functional part (60).

16. A plug connector according to claim 15, wherein the fastener (35) comprises two plug connectors (10), which, in the inserted state, engage in two holes (53) in the base plate (50) to which the functional part (60) is to be connected by the fastener (35).

17. A plug connector according to claim 16, wherein the two plug connectors (10) are designed as mirror images of each other.

18. A plug connector according to claim 1, wherein the plate is an electrical circuit board (50) having conductive pathways on which electrical components are mounted.

19. A plug connector according to claim 15, wherein the functional part consists of a shield housing (60), which is attached to the base plate (50) by several fasteners (35).

20. A plug connector according to claim 15, wherein the fastener (35) has a pair of clamping arms (37, 39) on the side opposite the plug connectors (10);
where, in the fastened state, the two clamping arms (37, 39) grip a web (87) of the functional part (60) between them and hold it in place.

21. A plug connector according to claim 20, wherein the free ends (74, 76) of the two clamping arms (37, 39) are connected to each other by a loop (85);
where, in the fastened state, the web (87) of the functional part (60) engages in the interior of the loop (86).

22. A plug connector according to claim 20, wherein the two clamping arms (37, 39) are seated as mirror images of each other on the fastener (35) and in the loose state extend at a slant to the central piece (36) of the fastener;
where, after the web (87) has been engaged, the free ends (74, 76) of the clamping arms (37, 39) are squeezed toward each other to establish the fastened state and thus secure the web (87) in the loop (85).

23. A plug connector according to claim 22, wherein, in the fastened state, the opening (89) of the loop (85) is narrower than the thickness of the web (87) of the functional part (60) or is completely closed.

* * * * *